(12) United States Patent
Wang et al.

(10) Patent No.: US 8,927,439 B1
(45) Date of Patent: Jan. 6, 2015

(54) ORGANOALUMINUM MATERIALS FOR FORMING ALUMINUM OXIDE LAYER FROM COATING COMPOSITION THAT CONTAINS ORGANIC SOLVENT

(71) Applicant: Rohm and Haas Electronic Materials LLC, Marlborough, MA (US)

(72) Inventors: Deyan Wang, Hudson, MA (US); Kathleen M. O'Connell, Cumberland, RI (US); Peter Trefonas, III, Medway, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 13/947,129

(22) Filed: Jul. 22, 2013

(51) Int. Cl.
*H01L 21/473* (2006.01)
*H01L 51/56* (2006.01)
*H01L 21/02* (2006.01)
*H01L 51/52* (2006.01)
*H01L 51/44* (2006.01)

(52) U.S. Cl.
CPC .......... *H01L 21/02178* (2013.01); *H01L 51/56* (2013.01); *H01L 51/5253* (2013.01); *H01L 51/448* (2013.01); *H01L 21/02282* (2013.01); *H01L 21/02205* (2013.01); *H01L 21/02318* (2013.01)
USPC .......................................... 438/781

(58) Field of Classification Search
CPC ................................................ H01L 21/02205
See application file for complete search history.

(56) References Cited

U.S. PATENT DOCUMENTS

| | | | |
|---|---|---|---|
| 5,091,009 A | 2/1992 | Nogami et al. | |
| 5,618,628 A | 4/1997 | Volpe | |
| 6,258,157 B1 * | 7/2001 | Gordon | 106/287.24 |
| 6,380,105 B1 | 4/2002 | Smith et al. | |
| 6,495,709 B1 * | 12/2002 | Celinska et al. | 556/183 |
| 6,736,890 B2 | 5/2004 | Haruta et al. | |
| 7,615,250 B2 * | 11/2009 | Peters et al. | 427/248.1 |
| 2003/0176065 A1 * | 9/2003 | Vaartstra | 438/688 |
| 2004/0071879 A1 * | 4/2004 | Callegari et al. | 427/255.28 |
| 2005/0003662 A1 * | 1/2005 | Jursich et al. | 438/681 |
| 2013/0337179 A1 | 12/2013 | Wang et al. | |

FOREIGN PATENT DOCUMENTS

WO     2012103390 A2    8/2012

OTHER PUBLICATIONS

U.S. Appl. No. 13/776,496, filed Feb. 2013, Wang et al.

* cited by examiner

*Primary Examiner* — Stephen W Smoot
(74) *Attorney, Agent, or Firm* — S. Matthew Cairns

(57) ABSTRACT

Organoaluminum coating compositions are used to deposit films on various substrates, which films are subsequently cured to form oxide films useful in a variety of manufacturing applications, particularly where a gas barrier may be used.

11 Claims, No Drawings

ORGANOALUMINUM MATERIALS FOR FORMING ALUMINUM OXIDE LAYER FROM COATING COMPOSITION THAT CONTAINS ORGANIC SOLVENT

The present invention relates generally to the field of solution-borne organometallic compounds, and more particularly to the field of manufacturing coated substrates using such solution-borne organometallic compounds.

The need for certain layers having etch selectivity in lithography and layers for blocking both oxygen and moisture in certain semiconductor fabrications, such as organic light emitting diode (OLED) fabrications or photovoltaic devices, have lead to the use of films containing oxymetal domains in the manufacture of electronic devices. Oxymetal layers are generally characterized as films containing a majority of inorganic domains with $(-M-O-)_n$ linkages (oxymetal domains), where M is a metal and n>1, and may also be composed of minor amounts of other elements, such as carbon. Layers composed of mixed domains, such as containing both oxymetal domains and metal nitride domains, may be used.

Conventional oxymetal films may contain one or more metals, such as Hf, Zr, Ti, W, Al, Ta and Mo, depending on the particular application. The etch resistance of oxymetal domain-containing films depends, in part, on the particular metal used as well as the level of $(-M-O-)_n$ domains present in the film, with an increased level of such domains providing greater etch resistance. Barrier films used in OLED applications conventionally contain Al or Si, that is $(-Al-O-)_n$ or $(-Si-O-)_n$ domains, respectively, where n>1. Aluminum oxide-containing films are known to have reduced transport of oxygen ($O_2$), while silicon oxide-containing films are known to have reduced transport of moisture vapor. Any defects in such barrier films, such as pinholes, or any other defect causing incomplete coverage of the lower film presents a possible pathway for gas or vapor to access the lower film.

Oxymetal films, such as alumina and silica films, are conventionally applied by chemical vapor deposition (CVD) onto an electronic device substrate. For example, International Pat. App. WO 2012/103390 discloses a stack having one or more oxide-containing barrier layers, such as aluminum oxide or silicon oxide layers, adjacent to a reactive inorganic layer on a flexible (plastic) substrate for reducing the transport of gas or vapor through the stack. According to this patent application, the reactive inorganic layer functions to react with any gas or vapor that penetrates through the barrier layer. This patent application fails to suggest any suitable materials for forming such barrier layers, and focuses on conventional film deposition techniques, such as vapor deposition techniques.

Spin-on techniques are widely used in electronic device manufacture and offer advantages over conventional vapor deposition methods of depositing films. For example, spin-on techniques can use existing equipment, can be completed within a few minutes, and can provide a uniform coating over a substrate. Conventional aluminum sources, such as $Al(Oi-Pr)_3$, suffer from very poor solubility in solvents conventionally used in electronic device manufacture as well as from high susceptibility to water/moisture. Such conventional aluminum sources typically form aluminum oxide particles upon exposure to moisture, such as the residual moisture found in common solvents. Such aluminum oxide particles pose problems in liquid dispensing systems and even if capable of being dispensed such particles pose defect issues during the manufacture of electronic devices. Accordingly, there is a need for aluminum sources and methods suitable for spin-on deposition of aluminum oxide-containing films for use as barriers in electronic device substrates. There is a further need for a method of depositing such aluminum oxide-containing barriers directly on an electronic device substrate rather than on a separate flexible (plastic) substrate.

The present invention provides is a method of forming an aluminum oxide layer comprising: providing a substrate; disposing a layer of a coating composition on the substrate, wherein the coating composition comprises: an organoaluminum compound of the formula $AlL^1_xL^2_y$; wherein $L^1=(C_1-C_6)$alkoxy; $L^2=(C_5-C_{20})\beta$-diketonate or $OR^1$; $R^1=(C_4-C_{10})$ hydrocarbyl moiety; x is an integer from 0 to 2; y is an integer from 1 to 3; and x+y=3; and (ii) an organic solvent having the formula $HOR^1$; and curing the coating composition to form an aluminum oxide layer on the substrate.

As used throughout this specification, the following abbreviations shall have the following meanings, unless the context clearly indicates otherwise: ca.=approximately; °C.=degrees Celsius; g=grams; mmol=millimoles; mL=milliliters; μL=microliters; μm=micrometers=microns; nm=nanometers; Å=angstroms; and rpm=revolutions per minute. All amounts are percent by weight ("wt %") and all ratios are molar ratios, unless otherwise noted. The term "oligomer" refers to dimers, trimers, tetramers and other relatively low molecular weight materials that are capable of further curing. "Alkyl" and "alkoxy" refer to linear, branched and cyclic alkyl and "alkoxy", respectively. By the term "curing" is meant any process that polymerizes or otherwise increases, such as by condensation, the molecular weight of a film or layer. The articles "a", "an" and "the" refer to the singular and the plural. All numerical ranges are inclusive and combinable in any order, except where it is clear that such numerical ranges are constrained to add up to 100%.

Aluminum sources suitable for use in the present invention are those organoaluminum compounds of the formula $AlL^1_xL^2_y$; wherein $L^1=(C_1-C_6)$alkoxy; $L^2=(C_5-C_{20})\beta$-diketonate or $OR^1$; $R^1=(C_4-C_{10})$hydrocarbyl moiety; x is an integer from 0 to 2; y is an integer from 1 to 3; and x+y=3. Preferably, $L^1=(C_1-C_4)$alkoxy, and more preferably $(C_1-C_3)$alkoxy. It is preferred that x is 0 or 1, and more preferably x=0. Preferably, $L^2=(C_5-C_{15})\beta$-diketonate or $OR^1$, and more preferably $L^2=OR^1$. As used herein, "$(C_4-C_{10})$hydrocarbyl" refers to any hydrocarbon moiety comprising 4-10 carbon atoms. Such $(C_4-C_{10})$hydrocarbyl moiety may be aromatic or aliphatic, and preferably is aliphatic. The $(C_4-C_{10})$hydrocarbyl moiety optionally comprises one or more substituents selected from the group consisting of hydroxyl, carboxylic acid and $(C_1-C_6)$alkyl carboxylate, preferably hydroxyl and $(C_1-C_6)$alkyl carboxylate, more preferably hydroxyl and $(C_1-C_4)$alkyl carboxylate, and yet more preferably hydroxyl and $(C_2-C_4)$alkyl carboxylate. It is further preferred that the $(C_4-C_{10})$hydrocarbyl moiety of $R^1$ be bound to the oxygen through a secondary carbon atom. It is preferred that y=2 or 3, and more preferably 3. Most preferred organoaluminum compounds are those of the formula $AlL^2_3$, where $L^2$ is as defined above. It will be appreciated by those skilled in the art that organoaluminum compounds useful as aluminum sources in the present invention may form dimers or trimers in solution, particularly if small amounts of water are present. Such dimers or trimers may be successfully used in the present method. Accordingly, in solution, the present organoaluminum compounds may have the formula $Al_mO_{m-1}L^1_{x2}L^2_{y2}$; wherein $L^1$ and $L^2$ are as defined above; m=an integer from 1 to 3; x2=0 to 4; y2=1 to 5; and x2+y2=m+2. Such dimers or trimers may be successfully used in the present method.

The present organoaluminum compounds may be prepared by a variety of procedures known in the art, and are typically prepared by a ligand exchange reaction between a starting aluminum compound of the formula $Al((C_1-C_6)alkoxy)_3$ and a suitable higher order ligand, such as $HL^2$ or an alkali or alkaline earth salt thereof such as $K^+\ ^-L^2$, where $L^2$ is as defined above. Preferably, the higher order ligand used in the ligand exchange reaction has the formula $HL^2$, and more preferably has the formula $HOR^1$, where $R^1$ is as defined above. In a general procedure, the starting aluminum compound $Al((C_1-C_6)alkoxy)_3$ is combined with the higher order ligand and a suitable organic solvent in a flask. The mixture is then heated, typically to reflux, for a period of time to allow the desired ligand exchange to occur. Following this procedure, 1, 2 or all 3 of the $(C_1-C_6)$alkoxy ligands on the starting aluminum compound may be exchanged with a corresponding number of higher order ligands. It will be appreciated by those skilled in the art that the number of $(C_1-C_6)$alkoxy ligands replaced will depend on the steric hindrance of the particular $(C_1-C_6)$alkoxy ligand, the steric hindrance of the particular higher order ligand used, and the length of time the mixture is heated, with increasing length of time providing for greater ligand exchange. Suitable compounds useful as higher order ligands in the present invention include, but are not limited to: 2,4-octanedione; methyl glycolate; ethyl glycolate; ethyl lactate; 2-methyl-1-butanol; 4-methyl-2-pentanol; and diethyl tartrate. Preferred organic solvents are methyl glycolate; ethyl glycolate; ethyl lactate; and diethyl tartrate Any suitable organic solvent may be used for such ligand exchange reaction, and preferably the organic solvent has the formula $HOR^1$, where $R^1$ is as defined above. Preferably the higher order ligand is also used as the organic solvent for the ligand exchange reaction. In this way, a large excess of the higher order ligand is present, and typically all 3 of the $(C_1-C_6)$alkoxy ligands are replaced with higher order ligands, as indicated according to the following equation:

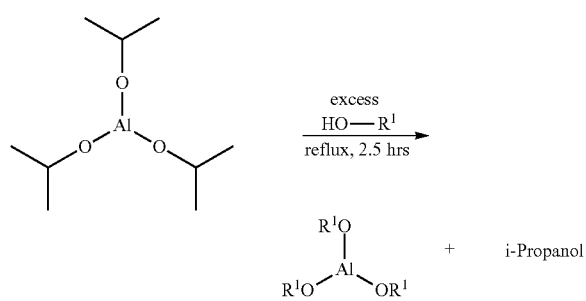

When the organic solvent used for the ligand exchange reaction is not a solvent having the formula $HOR^1$, then the organoaluminum compound comprising the higher order ligand, that is, $Al(OR^1)_3$ in the above equation, should be separated from such organic solvent and subsequently combined with a solvent having the formula $HOR^1$.

Preferred organic solvents for the ligand exchange reaction are those having the formula $HOR^1$, where $R^1$ is a $(C_4-C_{10})$ hydrocarbyl moiety, which is preferably aliphatic. Such $(C_4-C_{10})$hydrocarbyl moiety may optionally comprise one or more substituents selected from the group consisting of hydroxyl, carboxylic acid and $(C_1-C_6)$alkyl carboxylate, preferably hydroxyl and $(C_1-C_6)$alkyl carboxylate, more preferably hydroxyl and $(C_1-C_4)$alkyl carboxylate, and yet more preferably hydroxyl and $(C_2-C_4)$alkyl carboxylate. Preferred organic solvents are α-hydroxy esters. It is also preferred that the $(C_4-C_{10})$hydrocarbyl moiety of $R^1$ be bound to the oxygen through a secondary carbon atom. Suitable organic solvents include, without limitation: methyl glycolate; ethyl glycolate; ethyl lactate; 2-methyl-1-butanol; 4-methyl-2-pentanol; and diethyl tartrate. Preferred organic solvents are methyl glycolate; ethyl glycolate; ethyl lactate; and diethyl tartrate.

Coating compositions useful in the present method comprise an organoaluminum compound of the formula $AlL^1_xL^2_y$, as described above, and an organic solvent of the formula $HOR^1$, also as described above. When the higher order ligand is also used as the organic solvent for the ligand exchange reaction, the reaction product may be used in the solvent without isolation. Preferably, the coating composition is filtered before use to remove any insoluble materials that form during the ligand exchange reaction.

The present coating compositions may optionally include one or more surface leveling agents (or surfactants) or binder polymers. While any suitable surfactant may be used, such surfactants are typically non-ionic. The amount of such surfactants useful in the present compositions is well-known to those skilled in the art, and typically is in the range of 0 to 2% by weight. A wide variety of binder polymers may be used, such as to provide improved coating quality or leveling over the substrate. Suitable binder polymers are disclosed in U.S. patent application Ser. No. 13/776,496.

Optionally, the present coating compositions may further comprise one or more curing agents to aid in the curing of the deposited organoaluminum film. Exemplary curing agents include thermal acid generators (TAGs) and photoacid generators (PAGs). Preferred curing agents are thermal acid generators. The amounts of such curing agents are within the ability of those skilled in the art. Any suitable curing agent may be used in the present coating compositions.

The present coating compositions are useful in forming an aluminum oxide layer on various substrates, such as electronic device substrates, packaging substrates, separations substrates, or any other substrate where a gas barrier may be used. A wide variety of electronic device substrates may be used in the present invention, such as: packaging substrates such as multichip modules; flat panel display substrates, including flexible display substrates; integrated circuit substrates; photovoltaic device substrates; substrates for light emitting diodes (LEDs, including organic light emitting diodes or OLEDs); semiconductor wafers; polycrystalline silicon substrates; and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Particularly suitable substrates for hardmask layers are patterned wafers, such as patterned silicon wafers, patterned sapphire wafers, and patterned gallium-arsenide wafers. Such wafers may be any suitable size. Preferred wafer diameters are 200 mm to 300 mm, although wafers having smaller and larger diameters may be suitably employed according to the present invention. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being batch fabricated. Preferred substrates are substrates for LEDs, and more preferably for OLEDs. Also preferred are flexible display substrates and photovoltaic device substrates, and more preferred are flexible display substrates for LEDs, and more preferably for OLEDs.

A layer of the present coating compositions may be disposed on a substrate, such as an electronic device substrate, by any suitable means, such as spin-coating, spray coating, slot-die coating, doctor blading, curtain coating, roller coating, dip coating, and the like. Spin-coating, spray coating and slot-die coating are preferred. In a typical spin-coating method, the present coating compositions are applied to an electronic device substrate which is spinning at a rate of 500 to 4000 rpm for a period of 15-90 seconds to obtain a desired layer of the organoaluminum compound on the substrate. It will be appreciated by those skilled in the art that the height of the organoaluminum compound layer may be adjusted by changing the spin speed, as well as the percentage solids in the coating composition.

During or after the deposition of a layer of the present coating compositions on a substrate, the layer is optionally baked at a relatively low temperature to remove any remaining solvent and other relatively volatile components to form a layer of the organoaluminum compound. Typically, the substrate is baked at a temperature of ≤125° C., preferably from 60 to 125° C., and more preferably from 90 to 115° C. The baking time is typically from 10 seconds to 10 minutes, preferably from 30 seconds to 5 minutes, and more preferably from 6 to 180 seconds. When the substrate is a wafer, such baking step may be performed by heating the wafer on a hot plate.

Following any baking step to remove solvent, the organoaluminum compound layer is cured, such as in an oxygen-containing atmosphere, such as air. The curing step is conducted preferably on a hot plate-style apparatus, though oven curing may be used to obtain equivalent results. Typically, such curing is performed by heating the organoaluminum compound layer at a curing temperature of ≥150° C., preferably 150 to 450° C., and more preferably from 200 to 400° C. The choice of final curing temperature depends mainly upon the desired curing rate, with higher curing temperatures requiring shorter curing times. Typically, the curing time may be from 10 seconds to 120 minutes. Shorter curing times are preferred, and are typically from 10 seconds to 10 minutes, preferably from 30 seconds to 5 minutes, and more preferably from 30 seconds to 3 minutes. It will be appreciated by those skilled in the art that longer curing times may be used. This curing step is performed in order to thermally decompose at least a portion of the organoaluminum compound, and preferably all of the organoaluminum compound, so that a hardmask layer containing oxyaluminum domains (aluminum oxide) having an $(-M-O-)_n$ linkage, where n>1, preferably n>2, more preferably n>5, yet more preferably n>10, and even more preferably n>25 are obtained. Typically, the amount of aluminum in the cured oxyaluminum domain-containing films may be up to 95 mol % (or even higher), and preferably from 50 to 95 mol %. Aluminum oxide layers formed from the present compositions contain oxy-aluminum domains, and may contain other domains, such as aluminum nitride domains, as well as optionally containing carbon, such as an amount of up to 5 mol % carbon.

When the present composition comprises an optional TAG, the organoaluminum compound layer should be heated to a temperature sufficient to activate the TAG and generate an acid. Typically, the temperature used to cure the organoaluminum compound layer to form the aluminum oxide-containing layer is sufficient to activate the TAG. Alternatively, when a PAG is used in the present compositions, the organoaluminum compound layer may be exposed to light of an appropriate wavelength or to an electron beam to generate the corresponding acid. Such exposure step may occur before, during or both before and during the step of curing the organoaluminum compound layer to form the aluminum oxide-containing film.

When the present organoaluminum layers are cured at temperatures ≥200° C., the resulting aluminum oxide-containing films are resistant to stripping (being removed) by solvents conventionally used in the application of antireflective coatings and photoresists. When the present organoaluminum oligomer layers are cured at temperatures ≥350° C., the resulting aluminum oxide-containing films are also resistant to stripping by alkaline or solvent developers conventionally used in the development of imaged photoresist layers.

The initial baking step may not be necessary if the final curing step is conducted in such a way that rapid evolution of the solvents and curing by-products is not allowed to disrupt the film quality. For example, a ramped bake beginning at relatively low temperatures and then gradually increasing to the range of 250 to 400° C. can give acceptable results. It can be preferable in some cases to have a two-stage curing process, with the first stage being a lower bake temperature of less than 250° C., and the second stage being a higher bake temperature preferably between 250 and 400° C. Two stage curing processes facilitate uniform filling and planarization of pre-existing substrate surface topography.

While not wishing to be bound by theory, it is believed that the conversion of the organoaluminum to aluminum oxide involves hydrolysis by moisture that is contained in the coating and/or adsorbed from the atmosphere during the deposition (casting) and curing processes. Therefore, the curing process is preferably carried out in air or in an atmosphere where moisture is present to facilitate complete conversion to aluminum oxide. The curing process can also be aided by exposure of the coating to ultraviolet radiation, preferably in a wavelength range of from about 200 to 400 nm. The exposure process can be applied separately or in conjunction with a thermal curing process.

The cured aluminum oxide-containing layer (or film) may suitably be used as a hardmask, dielectric layer, barrier layer or for any other suitable use in the manufacture of various devices. The cured aluminum oxide-containing layers of the present invention are particularly suitable for use as a barrier layer, such as an oxygen barrier, in the manufacture of LEDs, and preferably in the manufacture of OLEDs, or in packaging applications or as a low diffusion gas barrier in separations applications.

Depending on the particular application, the present aluminum oxide-containing layers may be subjected to further processing steps, such as patterning. Such further processing steps may require the application of one or more organic materials, such as photoresists and antireflective coatings, to the surface of the aluminum oxide-containing layer. Oxymetal containing layers typically have a surface energy that is very different from that of subsequently applied organic layers. Such a mismatch of surface energy causes poor adhesion between the oxymetal hardmask layer and the subsequently applied organic layer. In the case of a subsequently applied photoresist layer, such mismatch in surface energy results in severe pattern collapse. In order to make the surface of the present aluminum oxide-containing films more compatible with subsequently applied organic layers, the surface may optionally be treated with an appropriate surface treating agent.

Surface treating compositions useful for treating the present aluminum oxide-containing films surface are those disclosed in U.S. patent application Ser. No. 13/745,752 and comprise an organic solvent and a surface treating agent, where the surface treating agent comprises one or more surface treating moieties. Optionally, the surface treating composition may further comprise one or more additives, such as thermal acid generators, photoacid generators, antioxidants, dyes, contrast agents, and the like. A wide variety of organic solvents may suitably be used, such as, but are not limited to, aromatic hydrocarbons, aliphatic hydrocarbons, alcohols, lactones, esters, glycols, glycol ethers, and mixtures thereof. Exemplary organic solvents include, without limitation, toluene, xylene, mesitylene, alkylnaphthalenes, 2-methyl-1-butanol, 4-methyl-2-pentanol, gamma-butyrolactone, ethyl lactate, 2-hydroxyisobutyric acid methyl ester, propylene glycol methyl ether acetate, and propylene glycol methyl ether. Suitable solvents have a relatively higher vapor pressure than the surface treating agent, such that the solvent may be removed from the surface of the film leaving behind the surface treating agent. It is preferred that the organic solvents do not have free carboxylic acid groups or sulfonic acid groups. A wide variety of surface treating agents may be used in the surface treating compositions and may be polymeric or non-polymeric, and comprise one or more surface treating moieties. Exemplary surface treating moieties include hydroxyl (—OH), thiol (—SH), carboxyl (—CO$_2$H), betadiketo (—C(O)—CH$_2$—C(O)—), protected carboxyl, and protected hydroxyl groups. While amino groups will work, it is preferred that the surface treating agents are free of amino groups, and preferably free of nitrogen, as such groups may adversely affect the function of subsequently applied coatings such as chemically amplified photoresists. Protected carboxyl groups and protected hydroxyl groups are any groups which are cleavable under certain conditions to yield a carboxyl group or hydroxyl group, respectively. Such protected carboxyl groups and protected hydroxyl groups are well-known in the art. When the surface treating agent comprises one or more protected hydroxyl groups, it is preferred that a TAG or PAG be used in the surface treating composition.

Alternatively, rather than separately treating the formed aluminum oxide-containing layer with a surface treating agent, the present organoaluminum compound coating compositions may further comprise a surface treating agent having a surface energy of 20 to 40 erg/cm$^2$ and comprising a surface treating moiety chosen from hydroxyl, protected hydroxyl, protected carboxyl, and mixtures thereof, such as those described in copending U.S. patent application Ser. No. 13/745,753. A minimum of one surface treating moiety per surface treating agent molecule is required. There is no specific limit to the number of surface treating moieties per surface treatment agent molecule, as long as the surface energy of the surface treating agent has a (static) surface energy in the range of 20 to 40 erg/cm$^2$. It will be appreciated by those skilled in the art that increasing the amount of surface treating moieties in the surface treating agent molecule typically increases the surface energy of the molecule. When added to the organoaluminum coating compositions, the surface treating agent is substantially free of un-protected carboxylic acid groups (that is, the surface treating agent comprises ≤0.5 mol % un-protected or "free" carboxylic acid groups). In addition to the surface treating moiety, the surface treating agent also comprises one or more relatively more hydrophobic moieties, such as C$_{3-20}$alkyl groups and C$_{6-20}$aryl groups. It is believed that a branched or cyclic alkyl group is relatively more hydrophobic than the corresponding linear alkyl group, and that increasing the branching or cyclic nature of such a group helps lower the surface energy of the surface treating agent. Likewise, alkyl and aryl groups of increasing carbon chain length also lower the surface energy of the surface treating agent. When such a surface treating agent is added to the present organoaluminum coating compositions, a solvent system comprising a majority of a first solvent having a relatively low surface energy and a minority of a second solvent having a relatively higher boiling point than the first solvent, and where the second solvent has a higher surface energy (tension) than the surface energy of the surface treating agent.

While not wishing to be bound by theory, it is believed that when the surface treating agent is present in the organoaluminum coating compositions, the surface treating agent migrates toward the surface of the forming film during deposition of the coating compositions and/or during any subsequent solvent removal step. It is further believed that the relatively lower surface energy of the surface treating agent helps drive the surface treating agent to the air interface. It will be appreciated by those skilled in the art that such migration of the surface treating agent should substantially occur before the complete curing of the aluminum oxide-containing film. The formation of a cured aluminum oxide-containing film substantially prohibits migration of the surface treating agent. As the surface treating agent is present at the surface of the organoaluminum compound layer, the temperature used to cure the organoaluminum compound layer should be selected such that the surface treating agent does not substantially decompose. If higher curing temperatures are required, then more thermally stable surface treating agents, such as vinylaryl polymers such as hydroxystyrene polymers and polyhedral oligosilsesquioxane polymers may be used.

As surface energy is often difficult to measure, surrogate measurements, such as water contact angles, are typically used. The determination of water contact angles is well-known, and a preferred method uses using a Kruss drop shape analyzer Model 100, using deionized ("DI") water and a 2.5 µL drop size. Oxy-metal containing layers, such as aluminum oxide-containing layers, typically have a water contact angle of ≤50°, such as from 35 to 45°. Following treatment with a surface treating composition, the aluminum oxide-containing film surface typically has a water contact angle of ≥55°, such as from 55 to 70°. Following treatment with the surface treating agent, the aluminum oxide-containing film surface has a surface energy that substantially matches that of a subsequently applied organic layer, that is, the surface energy of the treated aluminum oxide-containing layer should be within 20% of the surface energy of a subsequently applied organic layer. Subsequent processing steps involving organic layers applied over the aluminum oxide-containing layer will have fewer defects as compared to aluminum oxide-containing films without such surface treatment.

EXAMPLE 1

4.0 g of aluminum tri-isopropoxide (Al(Oi-Pr)$_3$) was mixed with 50.0 g of ethyl lactate in a 250 mL round bottom flask fitted with a heating mantle and connected to a condenser. The ethyl lactate was not anhydrous and therefore contained a residual amount of water. With adequate stirring (magnetic stirring bar), the mixture was heated was heated to 88° C. (controlled by through a thermocouple) and maintained at this temperature for 2 hours. It was then brought to reflux and held at reflux for 1.5 hours. Heating was then stopped and the mixture was allowed to cool naturally to room temperature with stirring. Next, the solution was filtered through a 1.0 μm perfluoropolyethylene (PFPE) syringe filter to remove any insoluble materials, and then filtered through a 0.2 μm PFPE filter. The filtered solution was found to contain ca. 13.2% solid using the following weight loss method. This ligand exchange reaction in excess ethyl lactate provided tris((1-ethoxy-1-oxopropan-2-yl)oxy)aluminum.

Weight Loss Method:

Approximately 0.1 g of an obtained organoaluminum compound in solution was weighed into a tared aluminum pan. Approximately 0.5 g of the solvent used to form the organoaluminum compound (ethyl lactate) was added to the aluminum pan to dilute the test solution to make it cover the aluminum pan more evenly. The aluminum pan was heated in a thermal oven at approximately 110° C. for 15 minutes. After the aluminum pan cooled to room temperature, the weight of the aluminum pan with dried solid film was determined, and the percentage solid content was calculated.

EXAMPLE 2

4.0 g of Al(Oi-Pr)$_3$ was mixed with 50.0 g of ethyl lactate and 0.1 g (0.28 equivalents) of deionized (DI) water in a 250 mL round bottom flask fitted with a heating mantle and connected to a condenser. The ethyl lactate was not anhydrous and therefore contained a residual amount of water. With adequate stirring (magnetic stirring bar), the mixture was heated to 88° C. (controlled by through a thermocouple) and maintained at this temperature for 2 hours. It was then brought to reflux temperature and held at reflux for 1.5 hours. Heating was then stopped and the mixture was allowed to cool naturally to room temperature with stirring. The solution was then filtered through a 1.0 μm PFPE filter to remove any insoluble materials, and then filtered through a 0.2 μm PFPE filter. The filtered solution was found to contain ca. 8.8% solids using the weight loss method described in Example 1.

EXAMPLE 3

Example 2 was repeated except that 0.2 g (0.57 equivalents) of DI water was used. After filtering, the solution was found to contain ca. 7.8% solids using the weight loss method described in Example 1.

EXAMPLE 4

The procedure of Example 2 was repeated except that 0.5 g (1.42 equivalents) of DI water was used. After filtration, the solution was found to contain ca. 6.7% solids using the weight loss method of Example 1.

EXAMPLE 5

4.0 g of Al(Oi-Pr)$_3$ was mixed with 55.2 g of ethyl lactate in a 250 mL round bottom flask fitted with a heating mantle and connected to a condenser. The ethyl lactate was not anhydrous. With adequate stirring by way of magnetic stirring bar, the mixture was heated to reflux temperature and maintained at reflux for 2 hours. Heating was then stopped and the mixture was allowed to cool naturally to room temperature with stirring. Next 0.20 g (0.57 equivalents) of DI water and 15.0 g of ethyl lactate was mixed and the mixture was fed to the reaction flask over ca. 6.5 minutes with stirring. The reaction mixture was then heated to reflux temperature again and held at reflux for 2 hours, after which heating was stopped and the reaction mixture was allowed to cool naturally to room temperature. The reaction mixture solution was then filtered through a 1.0 μm PFPE filter to remove any insoluble materials, and then filtered through a 0.2 μm PFPE filter. After filtration, the solution was found to contain ca. 7.9% solids using the weight loss method of Example 1.

EXAMPLE 6

The procedure of Example 5 was repeated except that 50 g of ethyl lactate was used initially and a mixture of 0.30 g (0.85 equivalents) of DI water and 20.0 g of ethyl lactate was prepared and this mixture was fed to the reaction flask in a time period of ca. 8.0 minutes with stirring. After filtration, the solution was found to contain ca. 8.1% solids using the weight loss method of Example 1.

EXAMPLE 7

4.0 g of Al(Oi-Pr)$_3$ was added to 50 g of 2-methyl-1-butanol in a round bottom flask equipped with a heating mantle and a condenser. The mixture was then heated to the reflux temperature and held at the temperature for 5 hours. After removing any insoluble materials by filtration through PFPE syringe filters, the solution was found to contain 2 to 3% solids using the weight loss method of Example 1.

EXAMPLE 8

The procedure of Example 7 was repeated except that 50 g of propylene glycol monomethyl ether was used in place of the 2-methyl-1-butanol. After removing any insoluble materials by filtration through PFPE syringe filters, the solution was found to contain 2 to 3% solids using the weight loss method of Example 1.

EXAMPLE 9

6.5 g of the reaction mixture from Example 1 was weighed into a 20 mL glass vial along with 6.5 g of ethyl lactate. This diluted solution was then filtered through a 1.0 μm PFPE syringe filter once and then filtered through a 0.2 μm PFPE syringe filter multiple times into another 20 mL glass vial. The filtered sample was coated on different 200 mm (8 inch) silicon wafers at 1500 rpm. One wafer was then cured at each of 200, 250 and 350° C. for 60 seconds. The film thickness of the cured films was measured using a Therma-wave spectroscopic ellipsometer (Model 7341) 673 nm wavelength, and is summarized in Table 1.

TABLE 1

| Curing Temperature, ° C. | Film Thickness, Å |
|---|---|
| 200 | 1324 |
| 250 | 1165 |
| 350 | 834 |

Visual inspection of the wafers showed that all the films were of good quality. Each of the cured films was washed with ethyl lactate for 10 seconds, and no film stripping was observed, indicating the formation of a crosslinked network.

EXAMPLE 10

7.51 g of the reaction mixture from Example 3 was weighed into a 20 mL glass vial and mixed with 7.69 g of ethyl lactate. This diluted solution was then filtered through a 1.0 µm PFPE syringe filter once and then filtered through a 0.2 µm PFPE syringe filter multiple times into another 20 mL glass vial. The filtered sample was coated on a 200 mm (8 inch) bare silicon wafer at 1500 rpm followed by baking the coated film at 100° C. for 60 seconds. The coated wafer was then cured in a furnace at 400° C. for 30 minutes under air. Visually, the cured film was silver (aluminum like) in color and of a nicely formed film quality. The film thickness was measured using an ellipsometer with refractive index input value of 1.77 (for alumina) before and after it was baked at 380° C. for 30 minutes under $N_2$ to determine the thermal stability of the film. Excellent thermal stability was observed for the cured films as evidenced by constant film thickness before and after baking at 380° C.

EXAMPLE 11

Reaction mixture samples from Examples 5 and 6 were filtered through a 1.0 µm PFPE filter once to remove insoluble species in solutions. For this curing test, each of the two solutions was also filtered through a 0.2 µm PFPE filter 3 to 4 times before being processed. The process included spin coating the filtered solutions on a 200 mm bare silicon wafer at 1500 rpm followed by soft baking at 100° C. for 60 seconds. Film thicknesses were then measured using a THERMA-WAVE Spectroscopic Ellipsometer (Model 7341). The film thicknesses are reported in Table 2.

TABLE 2

| Sample | Film Thickness, Å |
|---|---|
| Example 5 | 2320 |
| Example 6 | 2496 |

Visually, very nice quality of films were obtained without noticeable defectivity or haze. The coated wafers were then cleaved into coupons of approximately 5×5 cm (2×2 inches), which were then subjected to curing bake at 400° C., for different curing times of 30, 60, 90 and 120 minutes in air. The test results exhibited a constant film thickness up to 90 minutes curing time. A slight film thickness drop was observed at 120 minutes curing time. The test results indicate that if a film is cured at 400° C. for 30 minutes the film thickness will remain unchanged for a subsequent 60 minute bake at the same temperature.

EXAMPLE 12

A multilayer barrier structure having an aluminum oxide barrier layer and a silicon oxide barrier layer was prepared as follows. The reaction mixture from Example 5 was filtered through a 1.0 µm PFPE filter once and then through 0.2 µm PFPE filter multiple times before being processed.

A silsesquioxane material was prepared as an oligomer of 50/9/15/26 tetraethyl orthosilicate/phenyl-trimethylsilane/vinyl-trimethylsilane/methyl-trimethylsilane in a 95/5 propylene glycol monomethylether acetate (PGMEA)/ethyl lactate solvent system using a known method. The formulation contained 2.18 wt % solids.

On a silicon wafer, the reaction mixture from Example 5 was spin coated at 1500 rpm followed by a curing bake at 350° C. for 60 seconds to form an aluminum oxide-containing film. On the cured aluminum oxide-containing film, a film of the silsesquioxane material was spin coated at 1500 rpm and then cured by baking at 350° C. for 60 seconds to form a silicon oxide-containing film. The total film thickness of the stack was then measured using the THERMA-WAVE Spectroscopic Ellipsometer as described in Example 11 and found to be 1902 Å.

EXAMPLE 13

The procedure of Example 12 was repeated except that the reaction mixture from Example 6 was used as the organoaluminum compound coating composition. The total film thickness of the stack was then measured using the THERMA-WAVE Spectroscopic Ellipsometer as described in Example 11 and found to be 1950 Å.

EXAMPLE 14

The procedure of Example 13 was repeated except that after the silsesquioxane film was cured, a second layer of the organoaluminum compound coating composition from Example 6 was spin coated on the surface of the cured silicon oxide-containing film and cured under the same conditions to form a second aluminum oxide-containing film. Next, a second layer of the silsesquioxane composition was spin coated on the surface of the second aluminum oxide-containing film, and then cured to form a second silicon oxide-containing film. This approach provided a multilayer (4-layer) barrier structure having alternating aluminum oxide-containing films and silicon oxide-containing films.

EXAMPLE 15

On a silicon wafer, the organoaluminum compound reaction mixture from Example 6 was spin coated at 1500 rpm followed by a curing bake at 350° C. for 2 minutes to form an aluminum oxide-containing film. On the cured aluminum oxide-containing film, a film of the polyphenylene resin (available from The Dow Chemical Company under the trade name SiLK resins) as a 10.8 wt % solution in 88.2/9.8/2 PGMEA/cyclopentane/gamma-butyrolactone was spin coated at 1500 rpm followed by curing at 380° C. for 2 minutes. Next, a second aluminum oxide-containing film was formed on the surface of the cured polyphenylene film by coating a layer of the composition from Example 6 on the surface of the cured polyphenylene film, and then baking at 380° C. for 30 minutes. A second polyphenylene layer was spin coated on the second aluminum oxide-containing film and cured under the same conditions as the first polyphenylene film. The resulting 4-layer stack had alternating layers of aluminum oxide-containing films and cured polyphenylene films.

EXAMPLE 16

The organoaluminum compound coating composition from Example 6 was spin coated on a bare silicon wafer at 1500 rpm followed by curing at 400° C. for 30 minutes to form an aluminum oxide-containing film. On the cured aluminum oxide-containing film, another layer of the organoaluminum compound coating composition from Example 6 was spin coated and then cured under the same conditions. These coating and curing steps were performed two more times to provide a 4-layer aluminum oxide-containing barrier stack.

EXAMPLES 17

The ligand exchange procedure of Example 1 is repeated except that the ethyl lactate is replaced with diethyl tartrate.

EXAMPLE 18

The ligand exchange procedure of Example 1 is repeated except that the ethyl lactate is replaced with methyl glycolate.

EXAMPLE 19

The ligand exchange procedure of Example 1 is repeated except that the ethyl lactate is replaced with ethyl glycolate.

EXAMPLE 20

The ligand exchange procedure of Example 1 is repeated except that the ethyl lactate is replaced with 2-methyl-1-butanol.

EXAMPLE 21

The ligand exchange procedure of Example 1 is repeated except that the ethyl lactate is replaced with 4-methyl-2-pentanol.

What is claimed is:

1. A method of forming an aluminum oxide layer comprising: providing a substrate; disposing a layer of a coating composition on the substrate, wherein the coating composition comprises: an organoaluminum compound of the formula $AlL^1_xL^2_y$; wherein $L^1=(C_1-C_6)$alkoxy; $L^2=(C_5-C_{20})\beta$-diketonate or $OR^1$; $R^1=(C_4-C_{10})$hydrocarbyl moiety; x is an integer from 0 to 2; y is an integer from 1 to 3; and x+y=3; and (ii) an organic solvent having the formula $HOR^1$; and curing the coating composition to form an aluminum oxide-containing layer on the substrate.

2. The method of claim 1 wherein x=0 or 1.

3. The method of claim 1 wherein x=0.

4. The method of claim 1 wherein the $(C_4-C_{10})$hydrocarbyl moiety comprises one or more substituents selected from the group consisting of hydroxyl, carboxylic acid and $(C_1-C_6)$ alkyl carboxylate.

5. The method of claim 1 wherein $L^1=(C_1-C_4)$alkoxy.

6. The method of claim 1 wherein the coating composition is cured by heating.

7. The method of claim 1 wherein the coating composition is disposed on the substrate by spin-coating, spray-coating or slot-die coating.

8. The method of claim 1 wherein the substrate is an electronic device substrate.

9. The method of claim 1 wherein the substrate is a flexible display substrate or a photovoltaic device substrate.

10. The method of claim 9 wherein the flexible display substrate comprises a light emitting diode.

11. The method of claim 1 further comprising the step of disposing a layer of second material on the aluminum oxide-containing layer, and curing the layer of second material.

* * * * *